(12) United States Patent
Tanaka et al.

(10) Patent No.: US 6,355,492 B1
(45) Date of Patent: Mar. 12, 2002

(54) PROCESS FOR THE MANUFACTURING OF OXIDE ELECTRODES FOR FERROELECTRIC CAPACITOR

(75) Inventors: Masahiro Tanaka; Miho Ami, both of Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/524,285

(22) Filed: Mar. 13, 2000

Related U.S. Application Data

(62) Division of application No. 09/010,040, filed on Jan. 21, 1998, now abandoned.

(30) Foreign Application Priority Data

Jan. 22, 1997 (JP) ............................................. 9-009480

(51) Int. Cl.$^7$ .............................................. H01L 21/00
(52) U.S. Cl. ................ 438/3; 438/3; 438/240; 438/381; 438/608; 438/650; 438/686
(58) Field of Search ........................ 438/3, 238, 240, 438/381, 393, 399, 608, 610, 622, 650, 658, 686, 762, 396, 244, 253

(56) References Cited

U.S. PATENT DOCUMENTS

| | | | | |
|---|---|---|---|---|
| 4,982,309 A | * | 1/1991 | Shepherd | 361/321 |
| 5,003,428 A | * | 3/1991 | Shepherd | 361/321 |
| 5,374,578 A | * | 12/1994 | Patel et al. | 438/3 |
| 5,466,629 A | * | 11/1995 | Mihara et al. | 438/3 |
| 5,555,486 A | * | 9/1996 | Kingon et al. | 361/305 |
| 5,576,928 A | * | 11/1996 | Summerfelt et al. | 361/321.1 |
| 5,581,436 A | * | 12/1996 | Summerfelt et al. | 361/321.1 |
| 5,619,393 A | * | 4/1997 | Summerfelt et al. | 361/321.1 |
| 5,708,302 A | * | 1/1998 | Azuma et al. | 257/751 |
| 5,763,633 A | * | 6/1998 | Vaartstra | 556/136 |
| 5,807,774 A | * | 9/1998 | Desu et al. | 438/240 |
| 5,821,005 A | * | 10/1998 | Kijima et al. | 428/701 |
| 5,852,307 A | * | 12/1998 | Aoyama et al. | 257/295 |
| 5,864,153 A | * | 1/1999 | Nagel et al. | 257/296 |
| 6,156,599 A | * | 12/2000 | Aoyama et al. | 438/238 |

* cited by examiner

Primary Examiner—Charles Bowers
Assistant Examiner—Asok Kumar Sarkar
(74) Attorney, Agent, or Firm—Rader, Fishman & Grauer PLLC; Ronald P. Kananen

(57) ABSTRACT

An electrode for a capacitor having two electrodes and a capacitor insulation layer formed of a dielectric film sandwiched between the two electrodes, at least one of the electrodes being formed of a metal layer and a metal oxide layer, and the metal oxide layer being formed by oxidizing a surface of the metal layer on the basis of a diffusion-controlling reaction and being positioned in an interface to the capacitor insulation layer.

27 Claims, 10 Drawing Sheets

[STEP-320]

[STEP-330]

[STEP-340]

[STEP-350]

[STEP-360]

[STEP-360] CONTINUED

[STEP-370]

[STEP-370] CONTINUED

[STEP-410]

[STEP-420]

[STEP-450]

PROCESS FOR THE MANUFACTURING OF OXIDE ELECTRODES FOR FERROELECTRIC CAPACITOR

This appln is a Division of Ser. No. 09/010,040 filed Jan. 21, 1998 abandoned.

BACKGROUND OF THE INVENTION AND RELATED ART

The present invention relates to an electrode for a capacitor suitable for use in a semiconductor memory cell in particular, said capacitor and a process for the manufacture of these.

A nonvolatile semiconductor memory cell using a ferroelectrics film (to be sometimes referred to as "FERAM" hereinafter) is a nonvolatile semiconductor memory cell which uses fast inversion of polarization of the ferroelectrics film and residual polarization thereof and permits rapid rewriting. A nonvolatile semiconductor memory cell having a ferroelectrics film under study at present can be classified into two memory cells, a memory cell based on a method of detecting a change in an amount of a stored charge on a ferroelectrics capacitor and a memory cell based on a method of detecting a change in resistance of a semiconductor caused by the spontaneous polarization of ferroelectrics. The semiconductor memory cell to be explained hereinafter in the present specification comes under the former, and it is, in principle, composed of a ferroelectrics capacitor and a selecting transistor and has a structure and constitution similar to those of DRAM.

In the nonvolatile semiconductor memory cell according to the method of detecting a change in the amount of the stored change on the ferroelectrics capacitor, data is written and read out by applying the P-E hysteresis loop of ferroelectrics shown in FIG. 11. When an external electric field is applied to a ferroelectrics film and then removed, the ferroelectrics film exhibits spontaneous polarization. The residual polarization of the ferroelectrics film is $+P_r$ when an external electric field in a plus direction is applied, and it is $-P_r$ when an external electric field in a minus direction is applied. In this case, a state where the residual polarization is $+P_r$ (see "D" in FIG. 11) represents "0", and a state where the residual. polarization is $-P_r$ (see "A" in FIG. 11) represents "1".

For discriminating "1" or "0",for example, an external electric field in a plus direction is applied to the ferroelectrics film. As a result, the polarization of the ferroelectrics film is brought into a state "C" in FIG. 11. When data is "0" the polarization state of the ferroelectrics film changes from "D" to "C". On the other hand, when data is "1", the polarization state of the ferroelectrics film changes from "A" to "C" through "B". When data is "0", the ferroelectrics film causes no inversion of the polarization. On the other hand, when data is "1", the ferroelectrics film causes an inversion of the polarization. As a result, a difference is caused in the amount of transferred charge depending upon a difference in the stored charge amount (polarization state) of the ferroelectrics capacitor. The stored charge is detected as a signal current by turning on the selecting transistor of a selected semiconductor memory cell. When the external electric field is changed to "0", the polarization state of the ferroelectrics film is brought into a state "D" in FIG. 11 even when the data is any one of "0" and "1". When the data is "1", therefore, the polarization is brought into a state "A" through "D" and "E" by applying an external electric field in a minus direction, to write data "1".

The dielectric capacitor of the semiconductor memory cell is composed of two electrodes and a capacitor insulation layer formed of a dielectric film sandwiched between these two electrodes. In a conventional nonvolatile semiconductor memory cell (FERAM) using a ferroelectrics film, an upper electrode and a lower electrode are formed of platinum (Pt). Platinum is a stable material, while it has a defect that its processability is poor. It is therefore being studied to use Ru, $RuO_2$, Ir, $IrO_2$ or the like as an electrode material-having excellent processability over platinum, for high-density integrated DRAM or FERAM.

For stably maintaining the electric properties of a dielectric capacitor for a long period of time, desirably, the electrode in the interface with a dielectric film is composed of $RuO_2$ or $IrO_2$, as is discussed in "Improvement of Fatigue of PZT Capacitors by Optimizing Electrode Material and PZT Crystallinity", K. Aoki, et al., PacRimFerro 3 in Kyoto, extended abstract, pp 87–90 (1996). However, it is known that when Ru is oxidized, volatile ruthenium oxides, $RuO_3$ and $RuO_4$, are generally formed and that when Ir is oxidized at a high temperature, it is volatilized as $IrO_2$. When these metals are used as a lower electrode in particular, the lower electrode is exposed to a high-temperature atmosphere for a long period of time and the flatness of the lower electrode surface is impaired by evaporation and/or re-oxidation of these materials. As a result, there is caused a problem that the dielectric capacitor is degraded in characteristics.

OBJECT AND SUMMARY OF THE INVENTION

It is therefore an object of the present invention to provide an electrode for a capacitor, a dielectric capacitor of which is not degraded in characteristics when the electrode is exposed to a high-temperature atmosphere for a long period of time, said capacitor and a process for the manufacture of these.

According to the present invention, the above object of the present invention is achieved by an electrode for a capacitor composed of two electrodes and a capacitor insulation layer formed of a dielectric film sandwiched between the two electrodes, at least one of the electrodes being formed of a metal layer and a metal oxide layer, and said metal oxide layer being formed by oxidizing a surface of said metal layer on the basis of a diffusion-controlling reaction and being positioned in an interface to said capacitor insulation layer.

According to the present invention, the above object of the present invention is also achieved by a process for the manufacture of an electrode for a capacitor composed of two electrodes and a capacitor insulation layer formed of a dielectric film sandwiched between the two electrodes, The process comprising forming a metal layer, and then oxidizing a surface of said metal layer on the basis of a diffusion-controlling reaction by heat-treating said metal layer in an oxidizing atmosphere, to form a metal oxide layer, thereby forming at least one of the electrodes composed of the metal layer and the, metal oxide layer positioned in an interface to the capacitor insulation layer.

Further, according to the present invention, the above object is achieved by a capacitor composed of two electrodes and a capacitor insulation layer formed of a dielectric film sandwiched between the two electrodes, at least one of the electrodes being formed of a metal layer and a metal oxide layer, said metal oxide layer being formed by oxidizing a surface of said metal layer on the basis of a diffusion-controlling reaction and being positioned in an interface to said capacitor insulation layer, and the dielectric film being formed of a dielectric material having a perovskite structure, a pseudo perovskite structure or a layer structure.

According to the present invention, the above object of the present invention is also achieved by a process for the manufacture of a capacitor composed of two electrodes and a capacitor insulation layer formed of a dielectric film sandwiched between the two electrodes, the process comprising forming a metal layer, and then oxidizing a surface of said metal layer on the basis of a diffusion-controlling reaction by heat-treating said metal layer in an oxidizing atmosphere, to form a metal oxide layer, thereby forming at least one of the electrodes composed of the metal layer and the metal oxide layer positioned in an interface to the capacitor insulation layer.

The present invention includes an embodiment in which the electrode has a two-layered structure of a metal layer and a metal oxide layer, or an embodiment in which the electrode is composed of an aggregate of metal particles and a metal oxide layer is formed on the entire surface, or on part of surface, of each particle. It depends upon conditions of forming the metal layer whether or not the electrode is composed of an aggregate of metal particles. The metal oxide layer can be checked for its presence by SIMS (secondary ion mass spectroscopy), Auger electron spectroscopy, an X-ray small angle scattering method or a general X-ray diffraction method.

In the present invention, the formation of the metal oxide layer and the control of the metal oxide layer thickness on the basis of a diffusion-controlling reaction can be carried out by properly controlling the atmosphere, the temperature and the period of time employed for the heat treatment. As an oxidizing atmosphere in the present invention, for example, there is used an oxygen gas atmosphere having a pressure of 0.5 MPa to 0.1 kPa. The oxygen gas concentration in the atmosphere is preferably 100% by volume to 1% by volume. Further, the temperature for the heat treatment is 800 K to 1130 K, preferably 873 K to 1073 K, more preferably 873 K to 973 K. The period of time for the heat treatment can be properly set depending upon treatment conditions such as an oxygen gas concentration and an ambient (substrate) temperature and a designed thickness of the metal oxide layer, and the heat treatment is carried out, e.g., for 10 to 55 minutes.

In the present invention, preferably, the metal layer is composed of ruthenium (Ru) or iridium (Ir), or it is composed of a ruthenium alloy or an iridium alloy. The metal layer may contain an additive such as yttrium (Y) or $Y_2O_3$. The amount of yttrium (Y) is preferably in the range of from 2 to 5% in terms of a $Y_2O_3$ volume percent.

The metal layer can be formed, for example, by a sputtering method, an electron beam evaporation method or an MOCVD (metal organic chemical vapor deposition) method. Further, the patterning of the metal layer and the metal oxide layer can be carried out, for example, by a milling method or an RIE (reactive ion etching) method.

In the present invention, the metal oxide layer has a thickness ($d_s$) of $1 \times 10^{-8}$ m to $1 \times 10^{-7}$ m (significant figure is 1 digit, $1 \times 10^{-8}$ m $\leq d_s \leq 1 \times 10^{-7}$ m), more preferably $1.0 \times 10^{-8}$ m to $1.3 \times 10^{-7}$ m (significant figure is 2 digits, $1.0 \times 10^{-8}$ m $\leq d_s \leq 1.3 \times 10^{-7}$ m). When the value of $d_s$ is in the above range, the process of forming the metal oxide layer proceeds mainly on the basis of a diffusion-controlling reaction, and a dense metal oxide layer can be formed.

In the method of the manufacture of an electrode for a capacitor or the method of the manufacture of said capacitor, provided by the present invention, preferably, the metal layer is temperature-increased up to a heat treatment temperature by a rapid temperature-raising method when the metal layer is heat-treated in the oxidizing atmosphere. That is, it is preferred to initiate the formation of the metal oxide layer by a so-called RTA method (rapid thermal annealing method). The temperature-raising rate for the metal layer is preferably at least 100 K/minute, more preferably at least 300 K/minute. When the temperature-raising rate for the metal layer is low, no dense metal oxide layer may be formed.

In the present invention, the dielectric film can be formed by a solution chemical deposition method (e.g., a sol-gel method or an MOD method), a chemical vapor deposition method (including a metal organic chemical vapor deposition method) or a physical vapor deposition method (a vacuum evaporation method including a laser abrasion method, or a sputtering method). The dielectric film can be patterned, for example, by a milling method or an RIE method. In the present invention, the dielectric film is preferably formed of a dielectric material having a perovskite structure, a pseudo perovskite structure or a layer structure. The dielectric film can be formed from a bismuth-layered-structure ferroelectrics material. The above bismuth-layered-structure ferroelectrics material comes under so-called non-stoichiometric compounds, and permits some tolerance ranges of contents in both of a metal element site and an anion (O, etc.) site. Further, not a few bismuth-layered-structure ferroelectrics materials show optimum electric characteristics when they have a composition somewhat deviated from their stoichiometric composition. The dielectric film in the present invention has the general formula, $$(Bi_2O_2)^{2+}(A_{m-1}B_mO_{3m+1})^{2-}$$

wherein A is at least one metal selected from the group consisting of Bi, Pb, Ba, Sr, Ca, Na, K and Cd, B is at least one metal selected from the group consisting of Ti, Nb, Ta, W, Mo, Fe, Co and Cr, and m is an integer of at least 1.

More specifically, the dielectric film in the present invention preferably contains, as a main crystal phase, a crystal phase of the formula (1), $$(Bi_X, Sr_{1-X})_2(Sr_Y, Bi_{1-Y})(Ta_Z, Nb_{1-Z})_2O_d \quad (1)$$

wherein $0.9 \leq X \leq 1.0$, $0.7 \leq Y \leq 1.0$, $0: \leq Z \leq 1.0$ and $8.7 \leq d \leq 9.3$.

Otherwise, the dielectric film in the present invention preferably contains, as a main crystal phase, a crystal phase of the formula (2), $$Bi_XSr_YTa_2O_d \quad (2)$$

wherein X+Y=3, $0.7 \leq Y \leq 1.3$ and $8.7 \leq d \leq 9.3$.

Further, more preferably, the dielectric film contains, as a main crystal phase, at least 85% by weight of a crystal phase of the formula (1) or (2). In the formula (1), $(Bi_X, Sr_{1-X})$ means that Sr is substituted in a site for originally present Bi in a crystal structure and that the Br:Sr amount ratio is X: (1−X), and $(Sr_Y, Bi_1)$ means that Bi is substituted in a site for originally present Sr in a crystal structure and that the Sr:Bi amount ratio is Y:(Y−1). The dielectric film containing, as a main crystal phase, a crystal phase of the formula (1) or (2) may contain a Bi oxide, oxides of Ta and Nb and composite oxides of Bi, Ta and Nb to some extent.

Otherwise, the dielectric film in the present invention may contain a crystal phase of the formula (3),

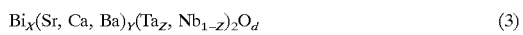

$$Bi_X(Sr, Ca, Ba)_Y(Ta_Z, Nb_{1-Z})_2O_d \quad (3)$$

wherein $1.7 \leq X \leq 2.5$, $0.6 \leq Y \leq 1.2$, $0 \leq Z \leq 1.0$ and $8.0 \leq d \leq 10.0$.

In the formula (3), (Sr, Ca, Ba)" stands for one element selected from the group consisting of Sr, Ca and Ba. The dielectric film of the formula (3) has a stoichiometric composition, e.g., of $Bi_2SrTa_2O_9$, $Bi_2SrNb_2O_9$, $Bi_2BaTa_2O_9$, or $Bi_2SrTaNbO_9$. Further, the dielectric film in the present invention may have a composition of $Bi_4SrTi_4O_{15}$, $Bi_4Ti_3O_{12}$ or $Bi_2PbTa_2O_9$. In the above cases, the amount ratio of metals may be varied so long as the crystal structure of the dielectric film does not change. That is, the contents in both of the metal element site and oxygen element site may be varied and may be deviated from their stoichiometric composition to some extent.

Further, the material for the dielectric film includes $PbTiO_3$, PZT $[Pb(Zr_{1-y}, Ti_y)O_3$ in which $0<y<1]$ which is a solid solution of $PbZrO_3$ and $PbTiO_3$ having perovskite structures, and PZT-containing compounds such as PLZT which is a metal oxide obtained by adding La to PZT and PNZT which is a metal oxide obtained by adding Nb to PZT.

The above materials for the dielectric film come under a so-called ferroelectrics material, while the material for the dielectric film also includes high-dielectric-constant materials having a perovskite structure or a pseudo perovskite structure such as $BaTiO_3$, $SrTiO_3$ and $(Ba, Sr)TiO_3$.

In the present invention, the metal oxide layer is formed by oxidizing the surface of the metal layer on the basis of a diffusion-controlling reaction, so that the dense metal oxide layer of passivity can be formed under controlled conditions. Further, the metal oxide layer of at least one of the electrodes is formed so as to be present in an interface to the capacitor insulation layer, so that the capacitor is free from the impairment of flatness of the electrode surface caused by evaporation and/or re-oxidation when the electrode is exposed to a high-temperature atmosphere for a long period of time.

BRIEF DESCRIPTION OF THE DRAWINGS

The present invention will be explained on the basis of Examples with reference to drawings.

DESCRIPTION OF THE PREFERRED EMBODIMENTS

EXAMPLE 1

In Example 1, studies were made on what process the oxidation process of forming a metal oxide layer by heat-treating a metal layer formed of ruthenium (Ru) in an oxidizing atmosphere to oxidize the surface of the metal layer was based on. Specifically, an Ru metal single-crystal powder (purity of at least 99.99%) having an average particle diameter of 10 $\mu$m was prepared, and attempts were made to analyze oxidation processes according to rate of chemical reaction in order to determine optimum layer structures. That is, a ruthenium oxide powder (purity 99.99%) was reduced under a nitrogen atmosphere having an atmospheric pressure at 1773 K for 1 hour, to obtain an Ru metal single-crystal powder having an average particle diameter of 10 $\mu$m. As an atmosphere for the oxidation process, there was employed an oxygen atmosphere or an oxygen-nitrogen mixture atmosphere (flow rate: 5 ml/minute).

The Ru metal single-crystal powder was heat-treated by holding it in a.0.1 MPa oxygen atmosphere (oxygen gas concentration: 100% by volume) at heat treatment temperatures [930 K (657° C.) and 1083 K (810° C.)] for t minutes, to oxidize Ru metal single-crystal powder surface, whereby a metal oxide layer was formed. The above Ru metal single-crystal powder on the surface of which a metal oxide layer was formed will be referred to as an oxide powder. The details of the time-temperature profile for the heat treatment were as shown in Table 1. "Attaining time" in Table 1 is a time required for attaining a stable heat treatment temperature (holding temperature) after the initiation of temperature raising, and the above "t" is a period of time after the temperature for the heat treatment was reached.

TABLE 1

| Heat treatment temperature (K) | 930 | 1083 |
|---|---|---|
| Temperature-raising rate (K/minute) | 553 | 553 |
| Maximum temperature (K) | 961 | 1116 |
| Attaining time (minute) | 4.4 | 4.1 |

Figure 1:
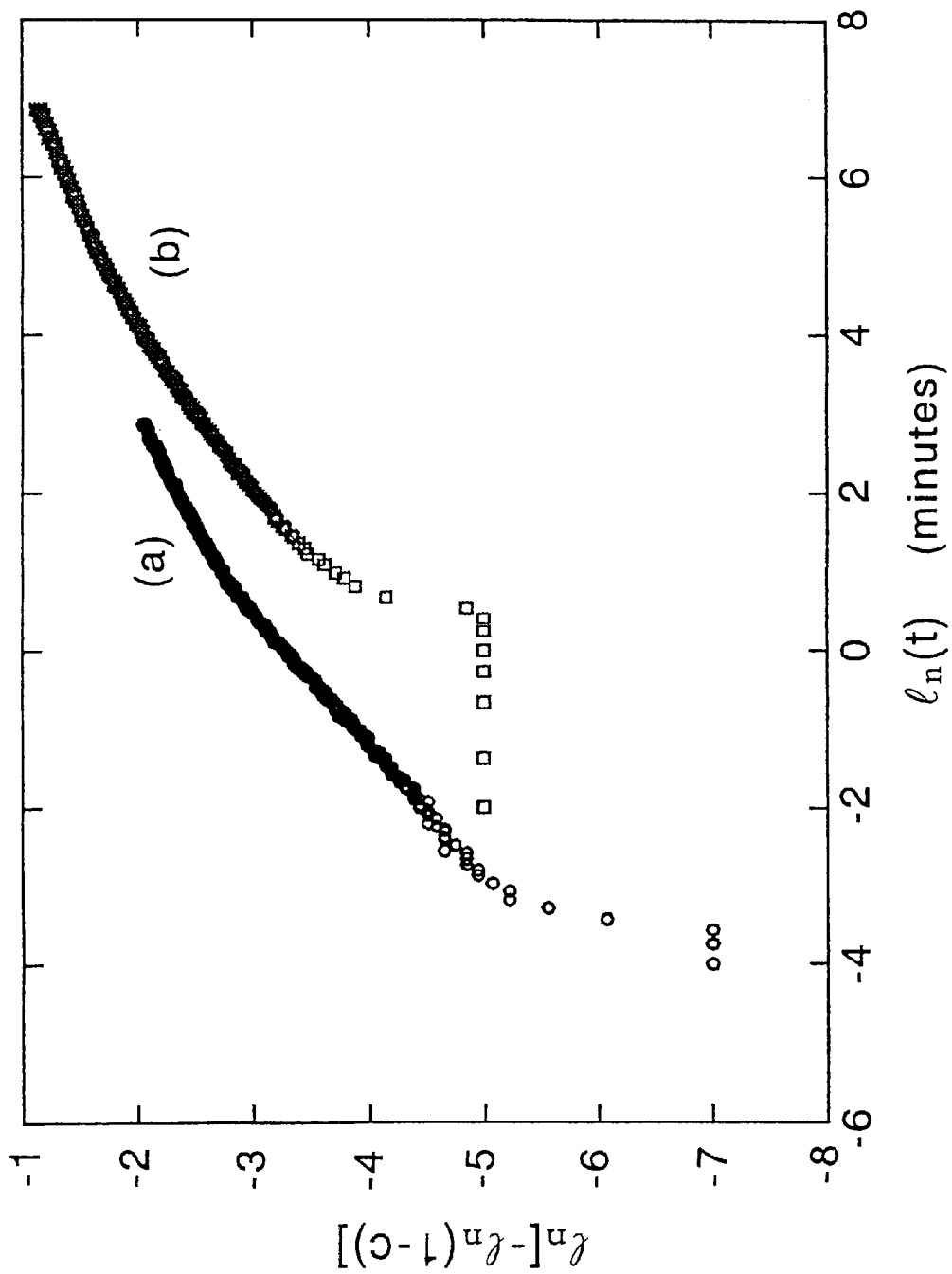
FIG. 1 is a graph showing the relationship between $\ln\{-\ln(1-C)\}$ and $\ln(t)$ in Example 1.

A reaction rate C toward $RuO_2$ was calculated on the basis of a difference between the mass of the oxide powder and the mass of the Ru metal single-crystal powder. A reaction rate of 1.0 means that the entire Ru metal single-crystal powder is oxidized to an $RuO_2$ powder FIG. 1 shows the obtained relationship between t and C. In FIG. 1, the axis of ordinates shows $\ln\{-\ln(1-C)\}$, and the axis of abscissas shows $\ln(t)$ (unit: minute). In FIG. 1, "(a)" indicates data obtained when the heat treatment temperature was set at 930 K, and "(b)"

indicates data obtained when the heat treatment temperature was set at 1083 K. Further, a graph of "(a)" which is displaced in parallel at −4.0 in the direction of X axis for avoiding its overlapping with a graph of "(b)". Data of "(a)" in FIG. 1 shows that the graph of "(a)" can approximate to a straight line having a slant n of 0.5 to 0.6 when the value of C is approximately between 0.08 and 0.0067, and data of "(b)" in FIG. 1 shows that the graph of "(b)" can approximate to a straight line having a slant n of 0.5 to 0.6 when the value of C is approximately between 0.08 and 0.5.

Meanwhile, Hancock and Sharp propose that the equation of Avrami is generally used as a rate equation (TOMINAGA Hiroo and KAWAMOTO Kunihito, "New Chemistry Text Series, Chemical Kinetics", published by "Shokodo").

$$C=1-\exp(-\alpha t^n)$$

The above equation is modified to $$\ln\{-\ln(1-C)\}=\ln(\alpha)+n\cdot\ln(t).$$

According to the above textbook, when n=0.54, a reaction is a three-dimensional diffusion-controlling reaction, and when n=0.64, a reaction is a unidimensional diffusion-controlling reaction.

The slant n of $\ln\{-\ln(1-C)\}$ can approximate to a slant of 0.5 to 0.6 on the basis of the results shown in FIG. 1. It is thereforeseen that when a metal oxide layer is formed by heat-treating an Ru metal single-crystal powder in a 0.1 MPa oxygen atmosphere while holding it at 930 K or 1083 K and thereby oxidizing the surface of the Ru metal single-crystal powder, the metal layer surface is oxidized on the basis of a diffusion-controlling reaction. When a metal oxide layer is formed on the basis of a diffusion-controlling reaction, a dense metal oxide layer can be formed.

The thickness $d_s$ determined on the basis of the value of C corresponds to 10 nm to 130 nm. The $d_s$ is calculated on the basis of the following equation when r is an average particle diameter of the Ru metal single-crystal powder.

$$C=(4\pi r^2 d_s)/\{(4\pi r^3)/3\}$$

Figure 2:
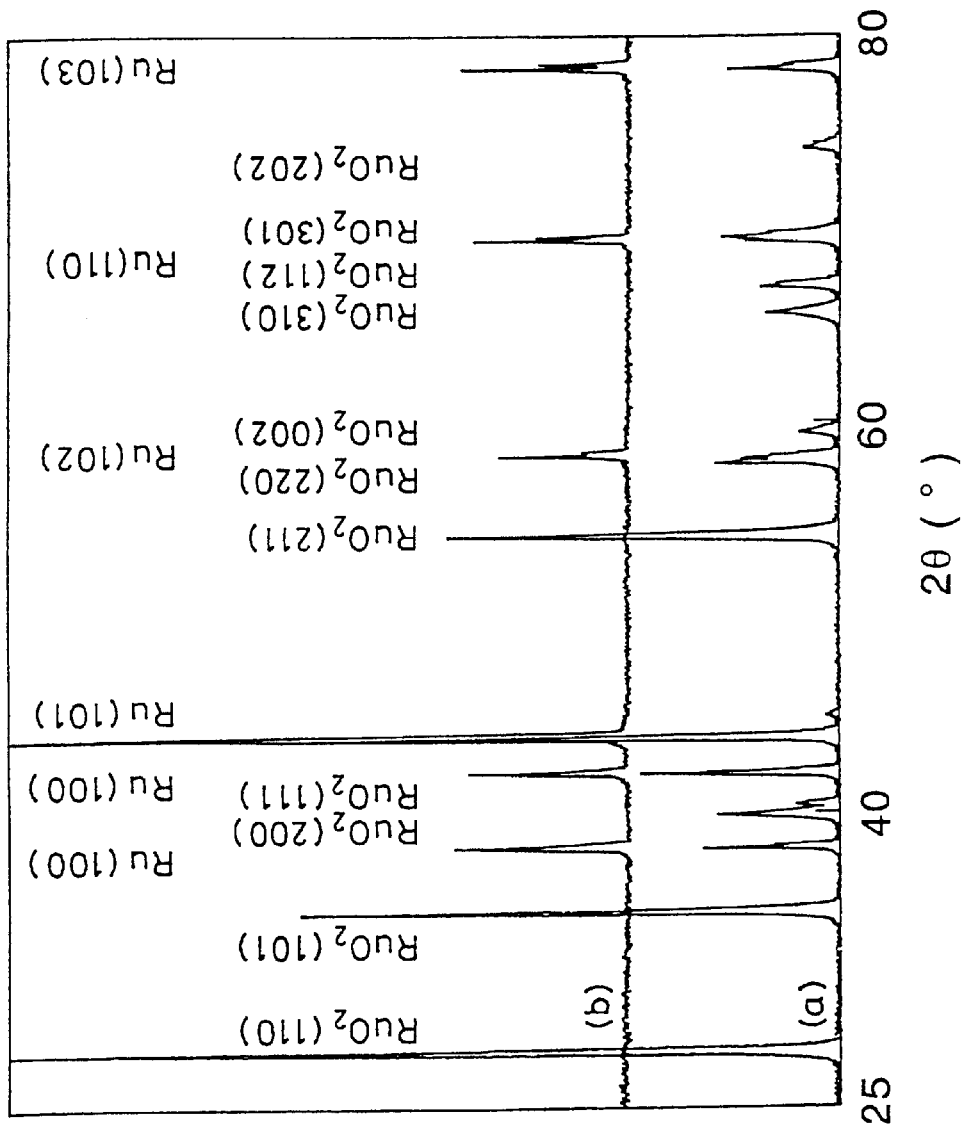
FIG. 2 shows X-ray diffraction patterns of an Ru metal single-crystal powder obtained and an Ru oxide powder in Example 1.

FIG. 2 shows X-ray diffraction patterns of the Ru metal single-crystal powder and the oxide powder. In FIG. 2, "(a)" indicates the X-ray diffraction pattern of the oxide powder, and "(b)" indicates the X-ray diffraction pattern of the Ru metal single-crystal powder. FIG. 2 shows that the oxide powder is formed of Ru and $RuO_2$ formed by oxidation of part of Ru.

EXAMPLE 2

In Example 2, metal oxide layers were formed by heat-treating Ru metal single-crystal powders by holding them in (A) a 0.1 MPa oxygen atmosphere (oxygen gas concentration: 100% by volume), (B) a 0.02 MPa oxygen atmosphere (oxygen gas concentration 20% by volume, nitrogen gas concentration 80% by volume), and (C) a 0.004 MPa oxygen atmosphere (oxygen gas concentration: 4% by volume, nitrogen gas concentration: 96% by volume), at 1083 K for t minutes and thereby oxidizing the surface of each Ru metal single-crystal powder.

Figure 3:
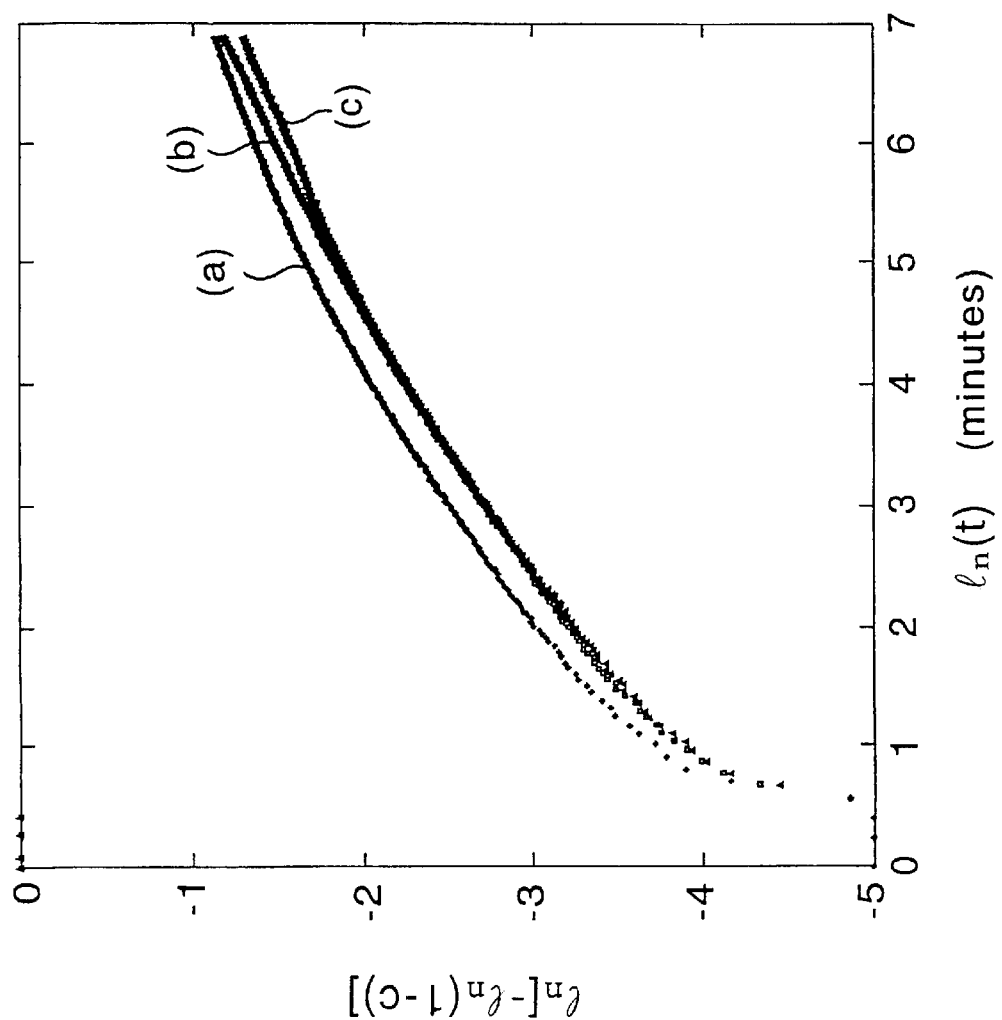
FIG. 3 is a graph showing the relationship between $\ln\{-\ln(1-C)\}$ and $\ln(t)$ in Example 2.

FIG. 3 shows the obtained relationship between t and C. In FIG. 3, the axis of ordinates shows $\ln\{-\ln(1-C)\}$, and the axis of abscissas shows ln(t) (unit: minute). In FIG. 3, "(a)" indicates data obtained when the oxygen atmosphere was set at 0.1 MPa, "(b)" indicates data obtained when the oxygen atmosphere was set at 0.02 MPa, and "(c)" 1 indicates data obtained when the oxygen atmosphere was set at 0.004 MPa.

The data "(a)" to "(c)" in FIG. 3 show that graphs can approximate to a straight line having a slant n of 0.5 when the value of C is approximately between 0.05 and 0.08. That is, it is seen that the surface of the metal layer is oxidized on the basis of a diffusion-controlling reaction. The thickness $d_s$ determined on the basis of the value of C corresponds to 80 nm to 130

The above Examples 1 and 2 show the following. A metal single-crystal powder is heat-treated in an oxidizing atmosphere to oxidize the surface of the metal single-crystal powder on the basis of a diffusion-controlling reaction, whereby a metal oxide layer can be formed. When the above metal oxide layer has a thickness $d_s$ of $1\times10^{-8}$ m $\leq d_s \leq 1\times 10^{-7}$ the metal oxide layer is formed by oxidation based on a diffusion-controlling reaction. The above Examples 1 and 2 carried out a test using a metal single-crystal powder, while it goes without saying that the test results can be applied to a metal layer as well.

EXAMPLE 3

In Example 3, an electrode for a capacitor for a semiconductor memory cell is prepared according to the process for the manufacture of an electrode for a capacitor and the process for the manufacture of the capacitor, provided by the present invention. The capacitor is composed of two electrodes and a capacitor insulation layer formed of a dielectric film (ferroelectrics film) sandwiched between the two electrodes. More specifically, the capacitor is composed of a lower electrode, a capacitor insulation layer formed of a ferroelectrics film formed on the lower electrode and an upper electrode formed on the capacitor insulation layer. In Example 3, a semiconductor memory cell is a so-called planar RAM, and the capacitor has the form of a flat plate. The process for the manufacture of an electrode for a capacitor and the process for the manufacture of the capacitor, provided by the present invention, will be explained with reference to FIGS. 4A to 7B hereinafter.

[Step-300]

First, a MOS transistor which is to work as a selecting transistor in a semiconductor memory cell is formed on a semiconductor substrate 10. For this purpose, a device separation region 11 having a LOCOS structure is formed according to a known method$_s$ The device separation region may have a trench structure, or it may have a combination of a LOCOS structure and a trench structure. Then, the surface of the semiconductor substrate 10 is oxidized, for example, by a pyrogenic method, to form a gate oxide layer 12, and then a polysilicon layer doped with a dopant is deposited on the semiconductor substrate 10. Then, the polysilicon layer is patterned to form a gate electrode 13 An extended region of the gate electrode 13 works as a word-line as well. The gate electrode 13 may be composed of a polyside or metal silicide in place of the polysilicon layer. Then, the semiconductor substrate 10 is implanted with impurity ions to form regions where source/drain regions are to be formed and regions which are to form LDD. Then, an $SiO_2$ layer is formed on the entire surface of the semiconductor substrate by a CVD method, and the $SiO_2$ layer is etched back to form gate side walls 14 on the side surfaces of the gate electrode 13. Then, the regions of the semiconductor substrate 10 where the source/drain regions are to be formed are implanted with ions d an impurity (dopant) implanted is for activaton, to form the source/drain regions 15.

[Step-310

Thereafter, an insulating interlayer 20, for example, Of $SiO_2$ is deposited on the entire surface of the semiconductor substrate 10. Then, a buffer layer 21 of Ti is deposited on the insulating interlayer 20 by sputtering, for improving the adhesion of a lower electrode layer to the insulating interlayer 20 and improving the crystallizability of the lower electrode layer. Then, a lower electrode layer 22A (corresponding to a metal layer) of Ru is formed (deposited) on the buffer layer 21 by sputtering (see FIG. 4A). The deposition conditions of the buffer layer 21 and the lower electrode layer 22A are as shown in Tables 2 and 3, in which "Distance from target" means a distance from a target to the semiconductor substrate.

TABLE 2

Deposition conditions of buffer layer of Ti.

| | |
|---|---|
| Target: | Ti |
| Process gas: | Ar = 40 sccm |
| Pressure: | 0.2 to 0.6 Pa |
| DC power: | 380 to 450 W |
| Distance from target: | 5 to 9 cm |
| Sputtering rate: | 5 to 10 nm/minute |
| Layer thickness: | About 30 nm |

TABLE 3

Deposition condition of lower electrode layer of Ru

| | |
|---|---|
| Target: | Ru |
| Process gas: | Ar = 30 sccm |
| Pressure: | 0.3 Pa |
| Power: | 200 W |
| Distance from target: | 80 to 90 mm |
| Sputtering rate: | 5 to 30 nm/minute |
| Layer thickness: | About 200 nm |

[Step-320]

Figure 4A:
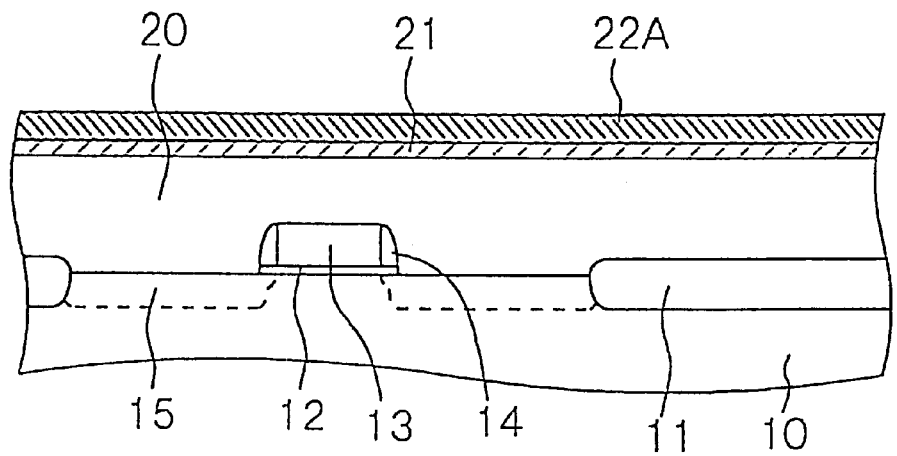
FIGS. 4A and 4B show schematic partial cross sectional views of a semiconductor substrate, etc., for explaining a process for the production of a semiconductor memory cell in Example 3.
Figure 4B:
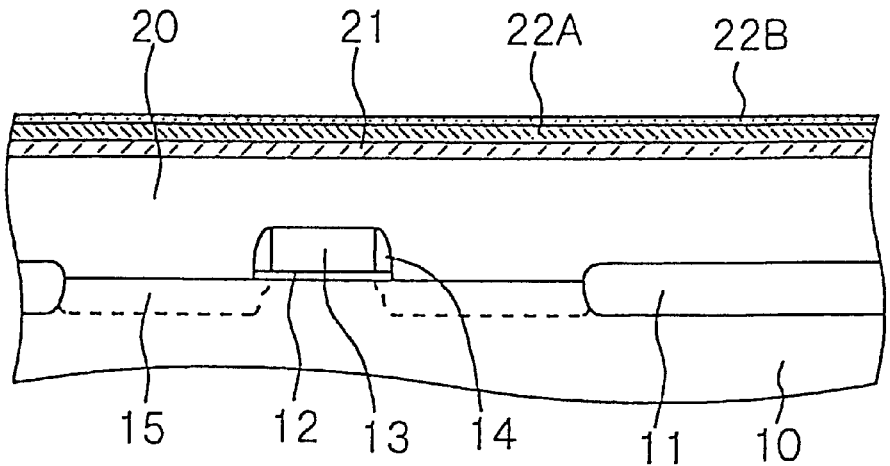

The lower electrode layer 22A corresponding to a metal layer is heat-treated in a 0.1 MPa oxidizing atmosphere at 930 K for 50 minutes, to oxidize the surface of the lower electrode layer 22A on the basis of a diffusion-controlling reaction, whereby a metal oxide layer 22B ($RuO_2$ layer) is formed (see FIG. 4B). The metal oxide layer 22B has a thickness $d_s$ of 70 nm. When the lower electrode layer 22A (metal layer) is heat-treated in the oxidizing atmosphere, the lower electrode layer 22A is temperature-raised up to 930 K, which is a heat treatment temperature, by a rapid temperature-raising method. The temperature raising rate is set at 100 K/second.

[step-330]

Then, ferroelectrics film 23A of a Bi-containing layered-structure perovskite type ferroelectrics material is formed (deposited) on the entire surface of the metal oxide layer 22B, for example, by an MOCVD method. The following Table 4 shows deposition conditions of the ferroelectrics film 23A, e.g., formed of $Bi_xSr_yTa_2O_d$ of the formula (2). In Table 4, "thd" stands for tetramethylheptanedione. Further, source materials shown in Table 4 are dissolved in a solvent containing tetrahydrofuran (THF) as a main component.

TABLE 4

Deposition by MOCVD method

| | |
|---|---|
| Source materials: | $Sr(thd)_2$-tetraglyme |
| | $Bi(C_6H_5)_3$ |
| | $Ta(O-iC_3H_7)_4(thd)$ |
| Deposition temperature: | 400 to 700° C. |
| Process gas: | $Ar/O_2 = 1000/1000$ cm³ |
| Deposition rate: | 5 to 20 nm/minute |

Alternatively, a ferroelectrics film formed of $Bi_xSr_yTa_2O_d$ of the formula (2) may be deposited on the entire surface of the metal oxide layer 22B by a pulsed laser abrasion method, a sol-gel method or an RF sputtering method. The deposition conditions in these cases are as shown below. When a ferroelectrics film having a large thickness is deposited by a sol-gel method, spin coating and drying or a spin coating and burning can be repeated as required.

TABLE 5

Deposition by pulsed laser abrasion method

| | |
|---|---|
| Target: | $Bi_2SrTa_2O_9$ |
| Laser: | KrF excimer laser |
| wavelength: | 248 nm |
| pulse width: | 25 nanosecond, 5 Hz |
| Deposition temperature: | 400 to 800° C. |
| Oxygen concentration: | 3 Pa |

TABLE 6

Deposition by sol-gel method

| | |
|---|---|
| Raw materials: | $Bi(CH_3(CH_2)_3CH(C_2H_5)COO)_3$ |
| | [Bismuth 2-ethylhexanoate; $Bi(OOc)_3$] |
| | $Sr(CH_3(CH_2)_3CH(C_2H_5)COO)_2$ |
| | [Strontium 2-ethylhexanoate, $Sr(OOc)_2$] |
| | $Ta(OEt)_5$ [tantalum ethoxide] |
| Spin coating condition: | 3000 rpm × 20 seconds |
| Drying: | 250° C. × 7 minutes |
| Burning: | 400 to 800° C. × 1 hour |
| | (RTA treatment is applied as required) |

TABLE 7

Deposition by RF sputtering

| | |
|---|---|
| Target: | $Bi_2SrTa_2O_9$ ceramic target |
| RE power: | 1.2 W to 2.0 W/target 1 cm² |
| Ambient pressure: | 0.2 to 1.3 Pa |
| Deposition temperature: | Room temperature to 600° C. |
| Process gas: | $Ar/O_2$ flow rate = 2/1 to 9/1 |

[Step-340]

Figure 5A:
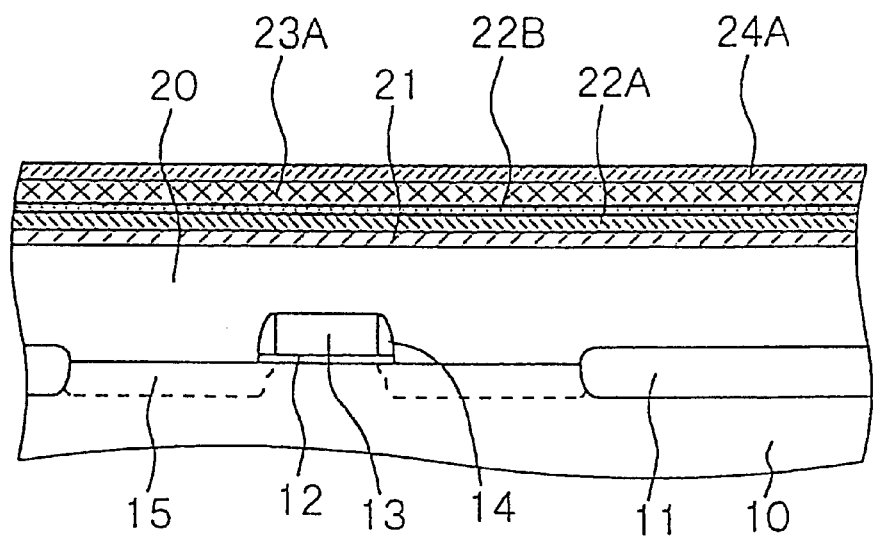
FIGS. 5A and 5B, subsequent to FIG. 4B, show schematic partial cross sectional views of a semiconductor substrate, etc., for explaining a process for the production of a semiconductor memory cell in Example 3.

Then, an upper electrode layer 24A of $RuO_2$ is formed (deposited) on the ferroelectrics film 23A by sputtering, whereby there can be obtained a structure which is composed of the lower electrode layer 22A (metal layer) and the metal oxide layer 22B formed by oxidizing the surface of thee lower electrode layer 22A. In this structure, the metal oxide layer 22B is positioned in an interface to the ferroelectrics film 23A, that is, the metal oxide layer 22B is positioned between the lower electrode layer 22A (the metal layer) and the ferroelectrics film 23A, as its partial cross sectional view is schematically shown in FIG. 5A.

[Step-350]

Figure 5B:
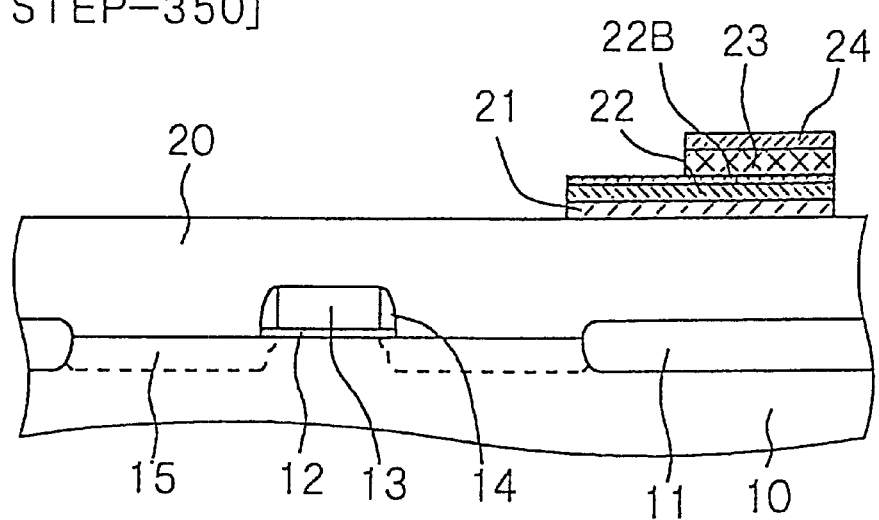

Then, the upper electrode 24A, the ferroelectrics film 23A, the lower electrode layer 22A and the buffer layer 21 are patterned by milling, to form a capacitor composed of a lower electrode 22, a capacitor insulation layer 23 and an upper electrode 24 (see FIG. 5B). The lower electrode 22 is composed of the lower electrode layer 22A (metal layer) and the metal oxide layer formed by oxidizing the surface of the lower electrode layer 22A (metal layer), and the metal oxide layer 22B is positioned in an interface to the capacitor insulation layer 23, that is, the metal oxide layer 22B is positioned between the lower electrode layer 22A (the metal layer) and the ferroelectrics film 23A.

[Step-360]

Figure 6A:
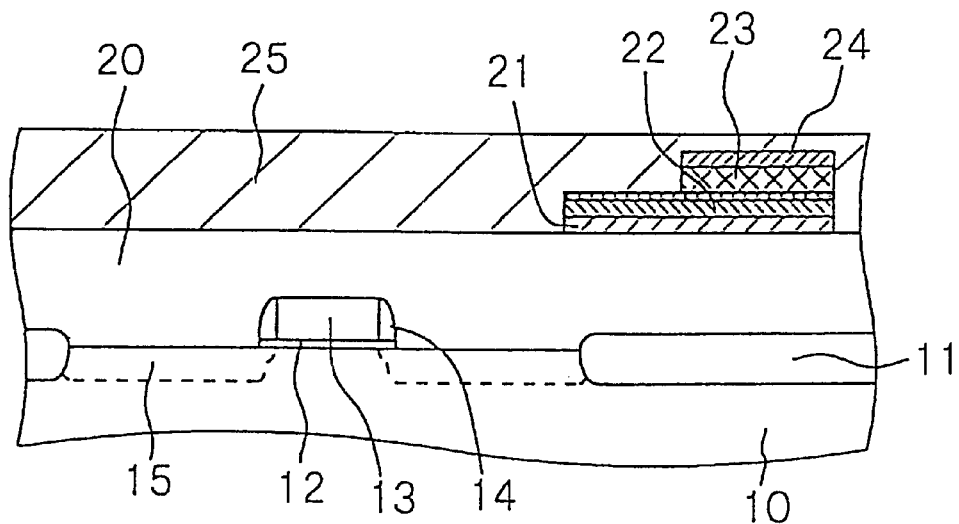
FIGS. 6A and 6B, subsequent to FIG. 5B, show schematic partial cross sectional views of a semiconductor substrate, etc., for explaining a process for the production of a semiconductor memory cell in Example 3.
Figure 6B:
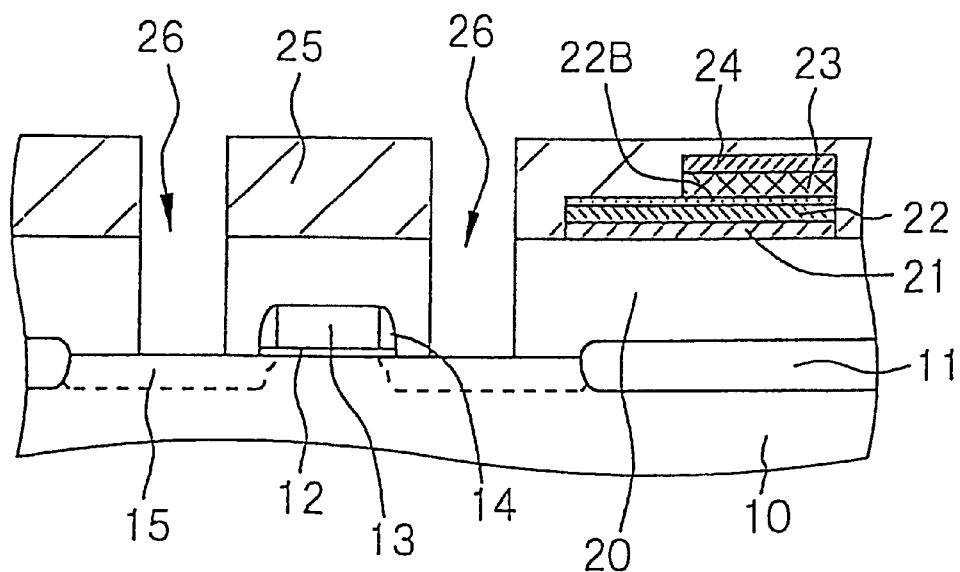

Then, an insulating layer 25 is deposited on the entire surface(see FIG. 6A), and thereafter, opening portions 26 are formed in the insulating layer 25 and the insulating interlayer 20 on the source/drain regions 15 (see FIG. 6B).

[step-370]

Figure 7A:
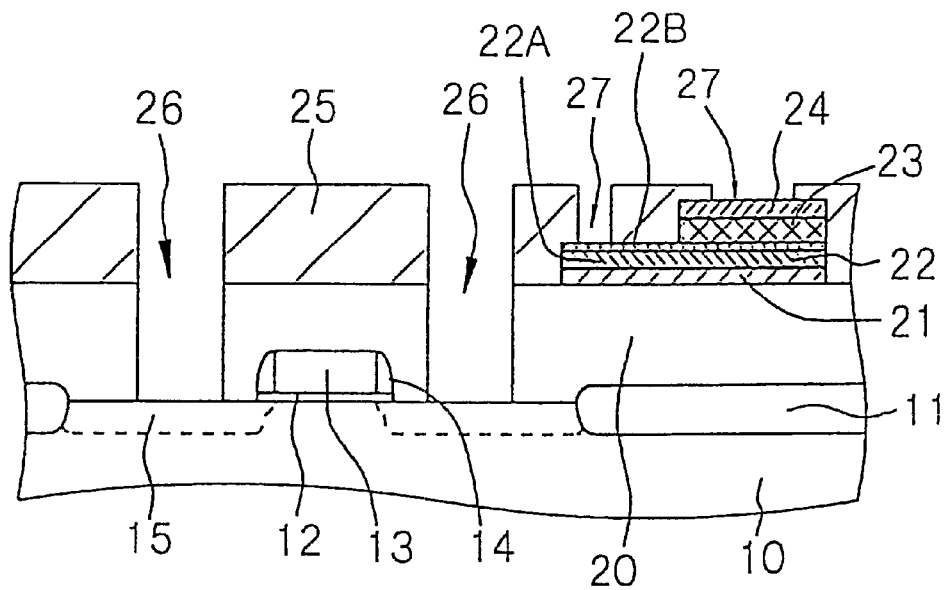
FIGS. 7A and 7B, subsequent to FIG. 6B, show schematic partial cross sectional views of a semiconductor substrate, etc., for explaining a process for the production of a semiconductor memory cell in Example 3.
Figure 7B:
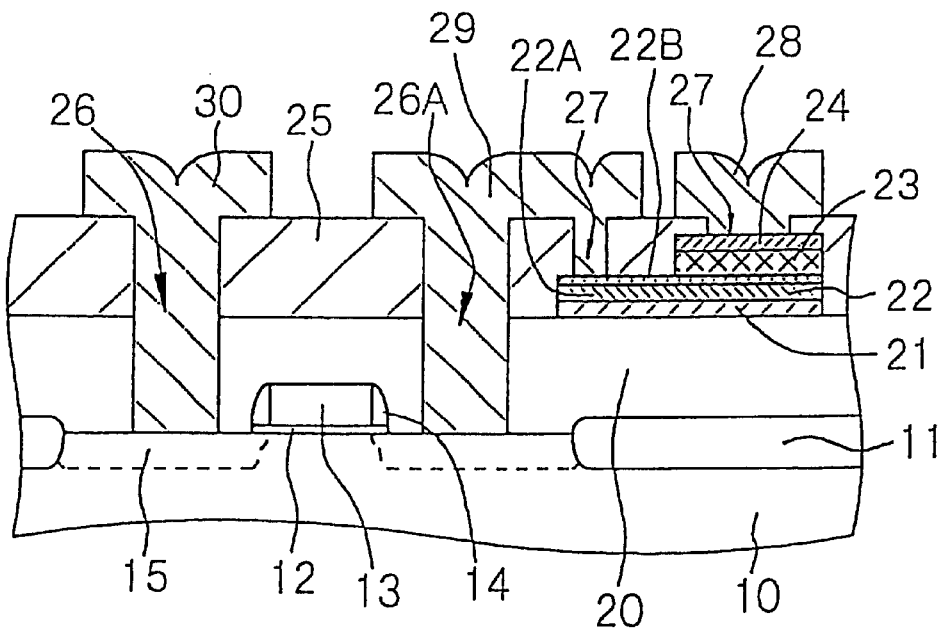

Then, an opening portion 27 is formed in that portion of the insulating layer 25 which is on the lower electrode 22 extending from the capacitor structure, and another opening portion 27 is formed in that portion of the insulating layer 25 which is on the upper electrode 24 (see FIGS. 7A). Thereafter, for example, a Ti layer, TiN layer, an aluminum alloy layer, a Ti layer, a TiN layer and a Ti layer are consecutively deposited on the insulating layer 25 including an inner surface of each of the opening portions 26 and the opening portions 27, and these layers are patterned, whereby one source/drain region 15 is electrically connected to the lower electrode 22 through a wiring 29 and a contact plug 26A. Further, a plate line 28 formed on the insulating layer 25 and the upper electrode 24 are connected to each other. Furthermore, a bit line 30 which is connected to the other source/drain region 15 is formed, whereby a semiconductor memory cell as shown in FIG. 7B is manufactured. Figures show each of the plate line 28, the wiring 29, the bit line 30, etc., as one layer. Finally, a passivation layer of SiN is formed on the entire surface by a plasma CVD method.

Between Step-350 and Step-360, preferably heat treatment is carried out in an oxygen-containing atmosphere at a temperature between 700° C. and 800° C. for 1 minute to 1 hour to improve the crystallinity of the ferroelectrics film. Otherwise, after the formation of the opening portions 27 in Step-370, more preferably, heat treatment is carried out in an oxygen-containing atmosphere at a temperature between 700° C. and 800° C. for 1 minute to 1 hour to improve the crystallinity of the ferroelectrics film.

EXAMPLE 4

In Example 4, a so-called stacked type RAM is manufactured according to the process for the manufacture of a capacitor, provided by the present invention. A capacitor has the form of a flat plate. The process for the manufacture of a capacitor for a semiconductor memory cell in Example 4 will be explained with reference to FIGS. 8A, 8B and 9 hereinafter.

[Step-400]

First, a MOS transistor is formed on a semiconductor substrate 10 in the same manner as in Step-300 in Example 3.

[Step-410]

Then, a first insulating interlayer of $SiO_2$ is deposited by a CVD method, and then, an opening portion 16 is formed in the first insulating interlayer on one source/drain region 15. A polysilicon layer doped with an impurity is deposited on the first insulating interlayer including an inner surface of the above opening portion 16. Then, the polysilicon layer on the first insulating interlayer is patterned to form a bit line 17. Thereafter, a second insulating interlayer of BPSG is deposited on an entire surface by a CVD method to be described below. Preferably, after the formation of the second insulating interlayer of BPSG, the second insulating interlayer is allowed to reflow in a nitrogen gas atmosphere, e.g., at 900° C. for 20 minutes. Further, preferably, the surface of the second insulating interlayer is chemically and mechanically polished, e.g., by chemical-mechanical polishing (CMP) to flatten the second insulating interlayer as required. A combination of the first insulating interlayer and the second insulating interlayer will be simply referred to as an insulating interlayer 20 hereinafter.

| | |
|---|---|
| Gas: | $SiH_4/PH_3/B_2H_6$ |
| Deposition temperature: | 400° C. |
| Reaction pressure: | Atmospheric pressure |

Figure 8A:
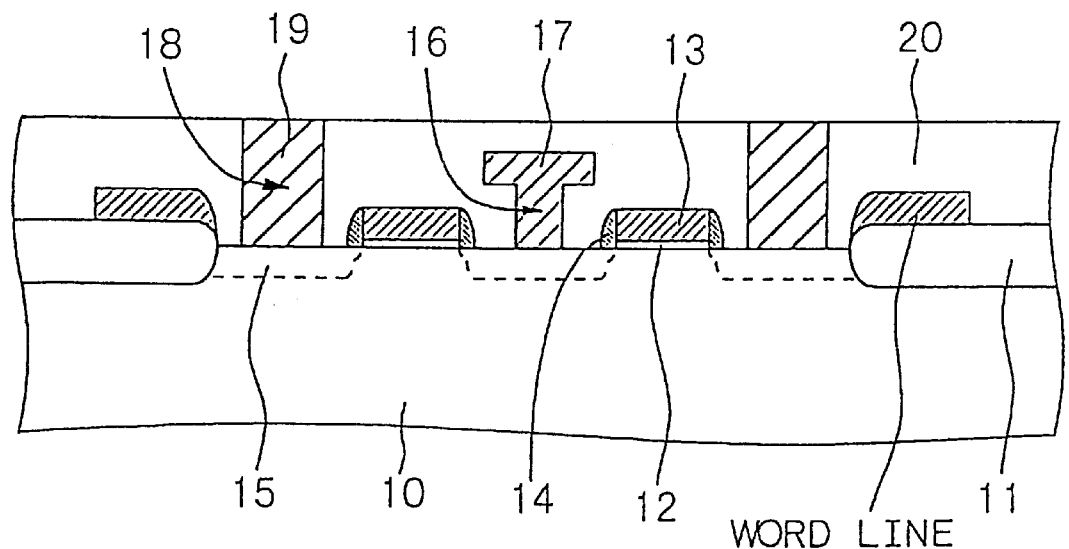
FIGS. 8A and 8B show schematic partial cross sectional views of a semiconductor substrate, etc., for explaining a process for the production of a semiconductor memory cell in Example 4.
Figure 8B:
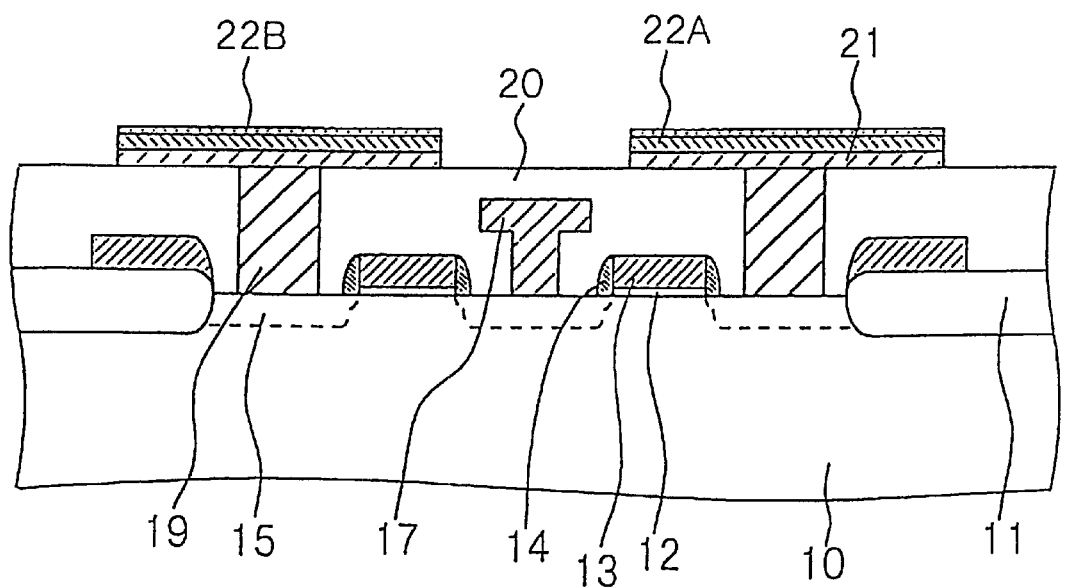
Figure 9:
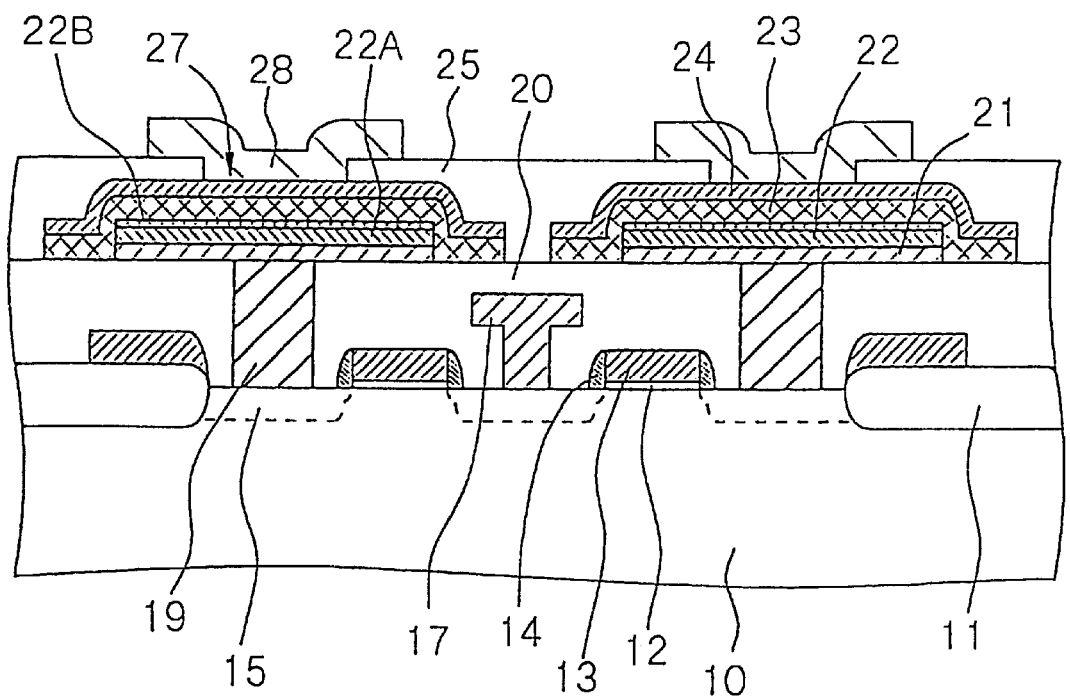
FIG. 9, subsequent to FIG. 8B, shows a schematic partial cross sectional view of a semiconductor substrate, etc., for explaining a process for the production of a semiconductor memory cell in Example 4.

Then, an opening portion 18 is formed in the insulating interlayer 20 on the other source/drain region 15 by an RIE method, and the opening portion 18 is filled with a polysilicon doped with an impurity to complete a contact hole (contact plug) 19, whereby a structure of which the partial cross section is schematically shown in FIG. 8A can be obtained. In FIGS. 8A, 8B and 9, a combination of the first insulating interlayer and the second insulating interlayer is indicated as the insulating interlayer 20. Further, the bit line 17, extends rightward and leftward in FIG. 8A, 8B and 9 on the first insulating interlayer so as to be out of contact with the contact hole 19, while such portion of the bit line is not shown in FIGS. 8A, and 9.

The contact hole (contact plug) 19 can be also formed by filling, e.g., a metal wiring material of a refractory metal or metal silicide such as W, Ti, Pt, Pd, Cu, TiW, TiNW, $WSi_2$, $MoSi_2$ and the like in the opening portion 18 formed in the insulating interlayer 20. The top surface of the contact hole 19 may be located at the same level as that of the surface of the insulating interlayer 20, or the top surface of the contact hole 19 may extend on the surface of the insulating interlayer 20. The condition of filling the opening portion 18 with tungsten to form the contact hole 19 is as shown in the following Table 8. Before filling the opening portion 18 with tungsten, a Ti layer and a TiN layer are consecutively deposited on the insulating interlayer 20 including an inner surface of the opening portion 18, e.g., by magnetron sputtering. The Ti layer and the TiN layer are formed for obtaining a low ohmic contact resistance, preventing the occurrence of damage in the semiconductor substrate 10 in a blanket tungsten CVD method and improving the adhesion of tungsten.

TABLE 8

| | |
|---|---|
| Sputtering condition of Ti layer (thickness: 20 nm) | |
| Process gas: | Ar = 35 sccm |
| Pressure: | 0.52 Pa |
| RF power: | 2 kW |
| Heating of substrate: | No |
| Sputtering condition of TiN layer (thickness: 100 nm) | |
| Process gas: | $N_2$/Ar = 100/35 sccm |
| Pressure: | 1.0 Pa |
| RF power: | 6 kW |
| Heating of substrate: | No |
| Deposition condition of tungsten by CVD method | |
| Gas: | $WF_6/H_2$/Ar = 40/400/2250 sccm |
| Pressure: | 10.7 kPa |
| Deposition temperature: | 450° C. |
| Etching conditions of tungsten, TiN layer and Ti layer | |
| Etching at first stage: Etching of tungsten layer | |
| Gas: | $SF_6$/Ar/He = 110/90/5 sccm |
| Pressure: | 46 Pa |
| RF power: | 275 W |
| Etching at second stage: Etching conditions of TiN layer/Ti layer | |
| Gas: | Ar/$Cl_2$ = 75/5 sccm |
| Pressure: | 6.5 Pa |
| RF power: | 250 W |

[Step-420]

Then, in the same manner as in Step-310 in Example 3, a buffer layer 21 of Ti is deposited on the insulating interlayer 20 by sputtering, and then a lower electrode layer 22A of Ru is deposited by sputtering. The deposition conditions of the buffer layer 21 of Ti and the lower electrode layer 22A of Ru can be the same as those shown in Tables 2 and 3. Then, in the same manner as in Step-320 in Example 3, the lower electrode layer 22A corresponding to a metal layer is heat-treated in an oxidizing atmosphere, to oxidize the surface of the lower electrode layer 22A on the basis of a diffusion-controlling reaction, whereby a metal oxide layer 22B ($RuO_2$ layer) is formed. Then, the lower electrode layer 22A including the metal oxide layer 22B and the buffer layer 21 are patterned (see FIG. 8B).

[Step-430]

Then, a ferroelectrics film of $Bi_xSr_yTa_2O_d$ of the formula (2) is formed on the entire surface including the surface of the metal oxide layer 22B. The ferroelectrics film is formed in the same manner as in Example 3.

[Step-440]

Thereafter, an upper electrode layer of $RuO_2$ is deposited on the ferroelectrics film by sputtering. Then, the upper electrode layer and the ferroelectrics film are patterned by an RIE method, to form a capacitor a composed of a lower electrode 22, an upper electrode 24 and a capacitor insulation layer 23 sandwiched between the lower electrode 22 and the upper electrode 24. In this manner, there can be obtained the lower electrode 22 which is composed of the lower electrode layer 22A (metal layer) and the metal oxide layer 22B obtained by oxidizing the surface of the lower electrode layer 22A (metal layer) and in which the metal oxide layer is positioned in an interface to the capacitor insulation layer 23, that is, the metal oxide layer 22B is positioned between the lower electrode layer 22A (the metal layer) and the ferroelectrics film 23A.

[Step-450]

Then, an insulating layer 25 is deposited on the entire surface, and an opening portion 27 is formed in the insulating layer 25 on the upper electrode 24 by an RIE method. Preferably, heat treatment is carried out in an oxygen-containing atmosphere at a temperature between 700° C. and 800° C. for 10 minutes to 1 hour, to improve the crystallinity of the ferroelectrics film. Then, a metal wiring material layer, e.g., of an aluminum alloy is deposited on the insulating layer 25 including an inner surface of the opening portion 27 by sputtering, and the metal wiring material layer is patterned to form a plate line 28, whereby there can be obtained a structure of which the partial cross section is schematically shown in FIG. 9. In some semiconductor memory cell, the bit line 17 may be formed after the plate line 28 is formed.

Figure 10:
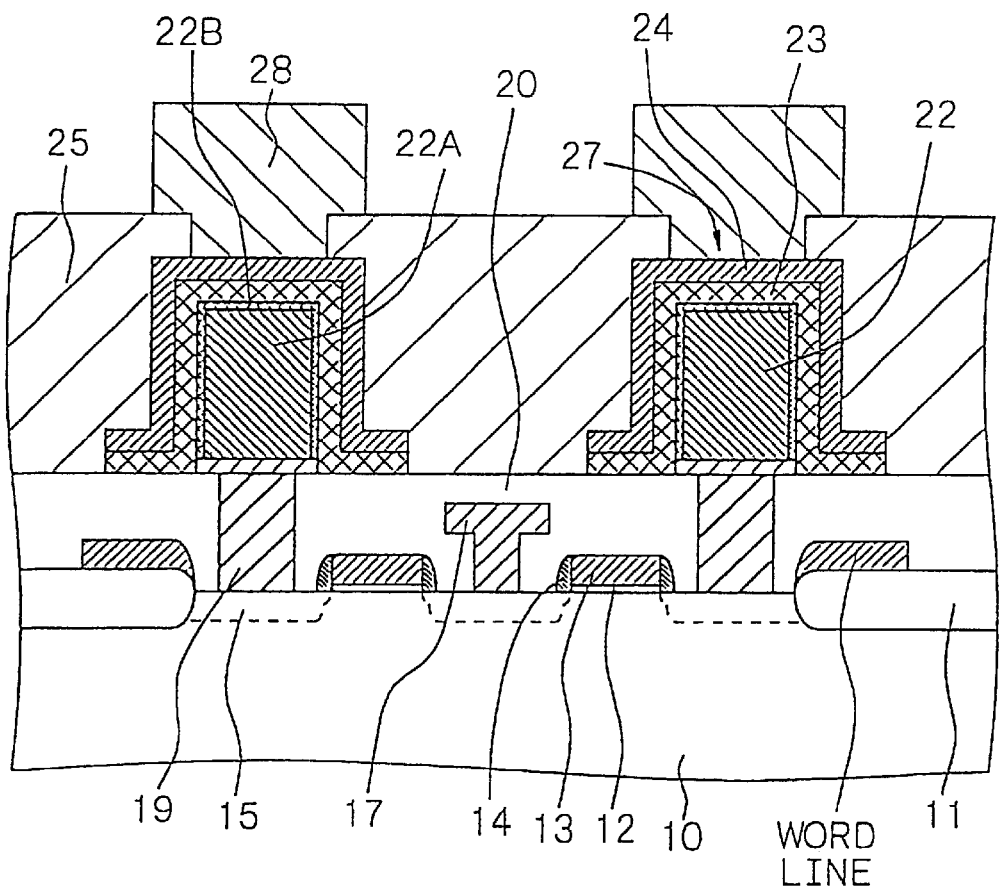
FIG. 10 is a schematic partial cross sectional view of a pedestal type semiconductor memory cell.
Figure 11:
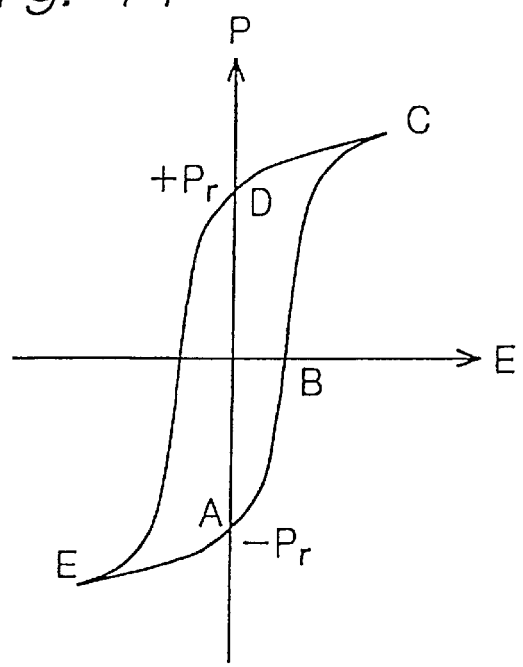
FIG. 11 shows a P-E hysteresis loop of ferroelectrics.

A pedestal type RAM which is a kind of a stacked type RAM can be produced in the same manner as in Example 4. That is, the capacitor may have the form of a column. In the pedestal type RAM of which the partial cross section is schematically shown in FIG. 10, a lower electrode has the form of a column, and a capacitor insulation layer 23 has a structure in which it covers the surface of the lower electrode 22. In this structure, the effective area of the capacitor insulation layer 23 can be expanded, that is, the amount of stored charge of the capacitor can be increased.

The present invention has been explained with reference to preferred embodiments hereinabove, while the present invention shall not be limited thereto. The forming conditions with regard to the lower electrode and the capacitor insulation layer in Examples are examples, and may be altered as required. In Examples, the lower electrode is composed of a metal layer and a metal oxide layer, while the upper electrode may be composed of a metal layer and a metal oxide layer, or each of the lower electrode and the upper electrode may be composed of a metal layer and a metal oxide layer.

The metal layer of Ru may be formed by an MOCVD method. In this case, $Ru(C_5H_7O_2)_3$ or $Ru(C_5H_5)_2$ is used as a raw material gas, and the formation can be carried out in a hydrogen gas atmosphere. Alternatively, a metal layer of Ru may be formed by an electron beam evaporation method (evaporation rate: 50 nm/minute) in which an Ru metal chip is irradiated with electron beam (500 W).

The dielectric film (ferroelectrics film) may be composed of PZT or PZLT in place of a Bi-containing layer structure perovskite type ferroelectrics material. Deposition conditions of magnetron sputtering of PZT or PZLT are as shown in the following Table 9. Alternatively, a dielectric film of PZT or PLZT may be formed by reactive sputtering, an electron beam evaporation method or an MOCVD method.

TABLE 9

| Target: | PZT or PZLT |
|---|---|
| Process gas: | $Ar/O_2$ = 90 vol %/10 vol % |
| Pressure: | 4 Pa |
| Power: | 50 W |
| Deposition temperature: | 500° C. |

Further, the dielectric film of PZT or PLZT can be also formed by a pulsed laser abrasion method. Deposition conditions in this case can be set as shown in the following Table 10.

TABLE 10

| Target: | PZT or PLZT |
|---|---|
| Laser: | KrF excimer laser |
| wavelength: | 248 nm |
| pulse width: | 25 nanosecond, 3 Hz |
| Output energy: | 400 mJ (1.1 J/cm$^2$) |
| Deposition temperature: | 550 to 600° C. |
| oxygen concentration: | 40 to 120 Pa |

In addition to $RuO_2$, examples of the material for constituting the upper electrode layer in the capacitor of the present invention include Ru, Ir, $IrO_2$, a stacked structure of $RuO_2$/Ru, a stacked structure of $IrO_2$/Ir, a stacked structure of Pd/Ti, a stacked structure of Pd/Ta, a stacked structure of Pd/Ti/Ta, $La_{0.5}Sr_{0.5}CoO_3$ (LSCO), a stacked structure of LSCO/Pd and $YBa_2Cu_3O_7$. In each stacked structure, the material described before "/" constitutes a ferroelectrics film side, and the material described after "/" constitutes a wiring side. The upper electrode layer can be formed by a sputtering method, a reactive sputtering method, an electron beam evaporation method, an MOCVD method or a pulsed laser abrasion method as required depending upon materials used for the formation. Further, the material constituting the upper electrode layer can be patterned, for example, by an ion milling method or an RIE method.

The deposition condition of forming an upper electrode layer, e.g., from LSCO by a pulsed laser abrasion method is as shown in the following Table 11.

TABLE 11

| | |
|---|---|
| Target: | LSCO |
| Laser: | KrF excimer laser |
| Wavelength: | 248 nm |
| Pulse width: | 25 nanosecond, 3 Hz |
| Output energy: | 400 mJ (1.1 J/cm$^2$) |
| Deposition temperature: | 550 to 600° C. |
| Oxygen concentration: | 40 to 120 Pa |

The capacitor of the present invention and the process for the manufacture thereof, provided by the present invention, can be applied not only to a nonvolatile semiconductor memory cell using a ferroelectrics film (so-called FERAM) but also to DRAM. In this case, the polarization of the ferroelectrics film is utilized in a range of an applied voltage where no inversion of the polarization takes place. That is, there is utilized a characteristic that a difference ($P_{max}-P_r$) between a maximum (saturation) polarization $P_{max}$ by an external electric field and a residual polarization $P_r$ when the external electric field is 0 has a constant relationship with the voltage of a power source or an approximately proportional relationship. The polarization state of the ferroelectrics film is constantly present between a saturation polarization ($P_{max}$) and a residual polarization ($P_r$), and no inversion of the polarization does not take place. Data is held by an refreshing operation. Alternatively, a capacitor may be composed of a dielectric film which is formed, e.g., of $BaTiO_3$, $SrTiO_3$ or $(Ba, Sr)TiO_3$, having a perovskite structure or a pseudo perovskite structure and having a high dielectric constant, to form a DRAM memory.

In the present invention, the surface of a metal layer is oxidized on the basis of a diffusion-controlling reaction, to form a metal oxide layer, so that a dense metal oxide layer can be formed. Further, the metal oxide layer of at least one electrode is Ad formed so as to be positioned in an interface to a capacitor insulation layer, and therefore, the flatness of the electrode surface is not at all impaired by evaporation and/or re-oxidation even when the electrode is exposed to a high-temperature atmosphere for a long period of time. There can be therefore manufactured an electrode for a capacitor which can be suitably used in a semiconductor memory cell and is highly reliable, and said capacitor.

What is claimed is:

1. A process for the manufacture of an electrode for a capacitor comprising two electrodes and a capacitor insulation layer formed of a dielectric film sandwiched between the two electrodes, the process comprising forming a metal layer formed of ruthenium or iridium, and further including Y or $Y_2O_3$, and then oxidizing a surface of said metal layer on the basis of a diffusion-controlling reaction by heat-treating said metal layer in a pressurized oxidizing atmosphere, to form a metal oxide layer, thereby forming at least one of the electrodes comprising the metal layer and the metal oxide layer positioned in an interface to the capacitor insulation layer.

2. The process according to claim 1, wherein the metal layer is formed of ruthenium or iridium.

3. The process according to claim 1, wherein the metal oxide layer has a thickness of $1 \times 10^{-8}$ m to $1 \times 10^{-7}$ m.

4. The process according to claim 1, wherein the metal layer is temperature-raised up to a heat treatment temperature by a rapid temperature-rising method when the metal layer is heat-treated in the oxidizing atmosphere.

5. A process for the manufacture of a capacitor comprising two electrodes and a capacitor insulation layer formed of a dielectric film sandwiched between the two electrodes, the process comprising forming a metal layer formed of ruthenium or iridium, and further including Y or $Y_2O_3$ and then oxidizing a surface of said metal layer on the basis of a diffusion-controlling reaction by heat-treating said metal layer in a oxidizing atmosphere, to form a metal oxide layer, thereby forming an electrode comprising the metal layer and the metal oxide layer positioned in an interface to the capacitor insulation layer, wherein the metal layer formed of ruthenium or iridium is temperature-raised up to a heat treatment temperature by a rapid temperature-raising method when the metal layer is heat-treated in the oxidizing atmosphere.

6. The process according to claim 5, wherein a dielectric film is formed on the metal oxide layer after the electrode comprising the metal layer and the metal oxide layer is formed.

7. The process according to claim 5, wherein the metal oxide layer has a thickness of $1 \times 10^{-8}$ m to $1 \times 10^{-7}$ m.

8. The process according to claim 5, wherein the dielectric film is formed of a dielectric material having a perovskite structure, a pseudo perovskite structure or a layer structure.

9. The process according to claim 8, wherein the dielectric film contains a main crystalline phase of the formula (1), $$(Bi_X, Sr_{1-X})_2(Sr_Y, Bi_{1-Y})(Ta_Z, Nb_{1-Z})_2O_d \qquad (1)$$

wherein $0.9 \leq X \leq 1.0$, $0.7 \leq Y \leq 1.0$, $0 \leq Z \leq 1.0$ and $8.77 \leq d \leq 9.3$.

10. The process according to claim 8, wherein the dielectric film contains a main crystalline phase of the formula (2), $$Bi_X Sr_Y Ta_2 O_d \qquad (2)$$

wherein $X+Y=3$, $0.7 \leq Y \leq 1.3$ and $8.7 \leq d \leq 9.3$.

11. The process according to claim 1, wherein the heat treating includes a temperature-raising rate for the metal layer at least 100 K/minute.

12. The process according to claim 1, wherein the heat treating includes a temperature-raising rate for the metal layer at least 300 K/minute.

13. The process according to claim 1, wherein a dielectric film is formed on the metal oxide layer after the electrode composed of the metal layer and the metal oxide layer is formed.

14. The process according to claim 1, wherein the metal layer is temperature-raised up to a heat treatment temperature by a rapid temperature-raising method when the metal layer is heat-treated in the oxidizing atmosphere.

15. The process according to claim 1, wherein the dielectric film is formed of a dielectric material having a perovskite structure, a pseudo perovskite structure or a layer structure.

16. The process according to claim 15, wherein the dielectric film contains a main crystalline phase of the formula (1), $$(Bi_X, Sr_{1-X})_2(Sr_Y, Bi_1Y)(Ta_Z, Nb_{1-Z})_2O_d \qquad (1)$$

wherein $0.9 \leq X \leq 1.0$, $0.7 \leq Y \leq 1.0$, $0 \leq Z \leq 1.0$ and $8.77 \leq d \leq 9.3$.

17. The process according to claim 15, wherein the dielectric film contains a main crystalline phase of the formula (2), $$Bi_X Sr_Y Ta_2 O_d \qquad (2)$$

wherein $X+Y=3$, $0.7 \leq Y \leq 1.3$ and $8.7 \leq d \leq 9.3$.

18. The process according to claim 5, wherein the heat treating includes a temperature-raising rate for the metal layer at least 100 K/minute.

19. The process according to claim 5, wherein the heat treating includes a temperature-raising rate for the metal layer at least 300 K/Minute.

20. The process according to claim 5, wherein said oxidizing atmosphere comprises oxygen gas having a pressure of 0.5 MPa to 0.1 kPa.

21. The process according to claim 1, wherein said heat treatment is performed at a temperature between 800 K and 1130 K.

22. The process according to claim 21, wherein said heat treatment is performed at a temperature between 873 K and 1073 K.

23. The process according to claim 22, wherein said heat treatment is performed at a temperature between 873 K and 973 K.

24. The process according to claim 5, wherein said heat treatment is performed at a temperature between 800 K and 113 K.

25. The process according to claim 24, wherein said heat treatment is performed at a temperature between 873 K and 1073 K.

26. The process according to claim 25, wherein said heat treatment is performed at a temperature between 873 K and 973 K.

27. The process according to claim 1, wherein Y is present in a range of from 2 to 5% by volume.

* * * * *

UNITED STATES PATENT AND TRADEMARK OFFICE
CERTIFICATE OF CORRECTION

PATENT NO. : 6,355,492 B1
DATED : March 12, 2002
INVENTOR(S) : Masahiro Tanaka

It is certified that error appears in the above-identified patent and that said Letters Patent is hereby corrected as shown below:

Column 16,
Line 57, replace "$(Sr_Y, Bi_iY)$" with -- $(Sr_Y, Bi_{i-Y})$ --.

Column 18,
Line 6, replace "113 K" with -- 1130 K --.

Signed and Sealed this

Third Day of June, 2003

JAMES E. ROGAN
*Director of the United States Patent and Trademark Office*